United States Patent [19]
Palsson et al.
[11] 3,757,141
[45] Sept. 4, 1973

[54] CIRCUIT ARRANGEMENTS FOR SUPPLYING AN ALTERNATING CURRENT POTENTIAL TO A LOAD

[75] Inventors: Sven Gunnar Palsson, Hestra; Jan Bertil Janocha, Trollhattan, both of Sweden

[73] Assignee: Isabergs Verkstads AB, Hestra, Sweden

[22] Filed: Jan. 10, 1972

[21] Appl. No.: 216,755

[30] Foreign Application Priority Data
Jan. 14, 1971 Sweden ................................ 380/71

[52] U.S. Cl. ........................ 307/252 N, 307/252 UA
[51] Int. Cl. ............................................ H03k 17/72
[58] Field of Search .................... 307/252 H, 252 N, 307/252 UA

[56] References Cited
UNITED STATES PATENTS

| | | | |
|---|---|---|---|
| 3,621,296 | 11/1971 | Berger | 307/252 N |
| 3,171,011 | 2/1965 | English | 307/252 N |
| 3,372,288 | 3/1968 | Wigington | 307/252 N |

*Primary Examiner*—John Zazworsky
*Attorney*—Bucknam and Archer

[57] ABSTRACT

A circuit arrangement for supplying an alternating current potential to an operating winding in a portable tool wherein a manually actuable switch connected to one terminal of the power source is connected in series with a thyristor connected to one terminal of the winding the other terminal of which is connected to the other terminal of the power source and the gate of the thyristor is connected to control elements bringing the thyristor in conducting state only during a time period in which the switch is actuated and the positive periods in said alternating current potential.

2 Claims, 3 Drawing Figures

PATENTED SEP 4 1973 3,757,141

CIRCUIT ARRANGEMENTS FOR SUPPLYING AN ALTERNATING CURRENT POTENTIAL TO A LOAD

The present invention relates to a circuit arrangement for supplying an alternating current potential to a load. This is particularly intended for driving a portable tool in which the load is a tool operating winding.

Swedish Patent 225,674 and Swedish printed application 305,849 describe circuits for partly identical fields of application. These prior art circuits, however, have a complicated construction because of a large number of components, and therefore a high price. Moreover, these circuits are less reliable because the interruption of the supply circuit takes place electronically through mechanical interruption in the circuit controlling the supply circuit.

According to the present invention the above disadvantages are removed from the arrangement indicated above, by providing manually actuable switch means connected between said power source and said load, a controllable valve connected between said switch means and said load in series with them and having a control electrode, and control means connected to said power source and said conrol electrode for setting said valve in conducting state only during at least a part of the positive periods in said alternating supply current potential during the time period in which said switch means is actuated.

The invention will be described more in detail in the following with reference to the accompanying drawing, in which.

Figure 1:
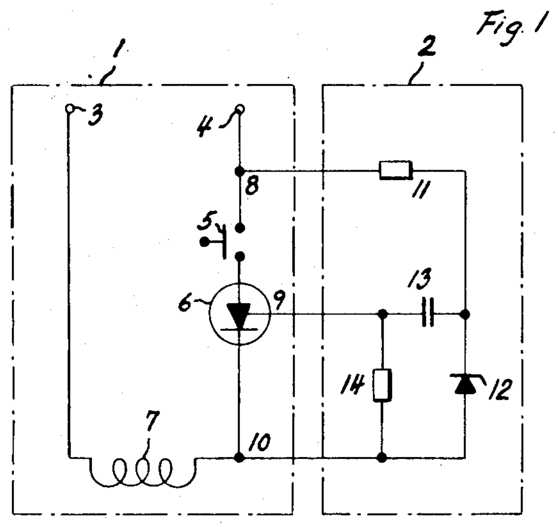
FIG. 1 is a circuit diagram of an embodiment of the invention.

The circuit shown in FIG. 1 is divided into two blocks 1 and 2 indicated by dot-and-dashed lines. The block 1 comprises a main circuit and the block 2 comprises a control circuit. The main circuit has two terminals 3 and 4 to which a suitable a.c. power source is to be connected. This power source preferably provides a voltage of 220 volts and a frequency of 50 Hz. The main circuit also includes a switch means 5, a thyristor 6 and a load 7. The switch means 5, the thyristor 6 and the load 7 are connected in series with each other and the series circuit formed is coupled to the terminals 3 and 4.

The control circuit comprised in the block 2 is connected to the main circuit at the points 8, 9 and 10. The point 8 consists of the connection between the terminal 4 and the switch means 5, the point 9 consists of the control electrode of the thyristor 6 and the point 10 consists of the connection between the thyristor 6 and the load 7. In the current path of the control circuit from the point 8 to the point 10 is a resistor 11 connected in series with a zener diode 12. The zener diode faces the resistor 11 and consequently it blocks in the direction of the point 10. The connection between the resistor 11 and the zener diode 12 is connected to the control electrode of the thyristor or the point 9 via a capacitor 13. Further, the connection between the capacitor 13 and the point 9 is joined to the connection between the zener diode 12 and the load 7 or the point 10 via a resistor 14. The resistor 11 is a limiting resistor while the resistor 14 is a matching resistor.

Figure 2:
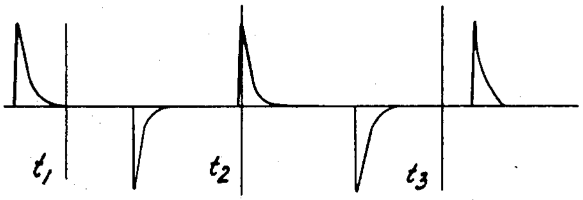
FIGS. 2 and 3 show wave-forms serving to facilitate the understanding of the function of the circuit shown in FIG. 1.
Figure 3:
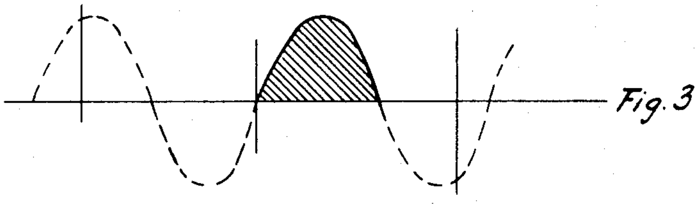

The function of the arrangement described in the foregoing will now be described in more detail in conjunction with FIGS. 2 and 3. The control circuit proper in the block 2 is supplied with a.c. voltage via the point 8. At each zero transition in the a.c. voltage supplied to the control circuit the voltage spike shown in FIG. 2 appears in the point 9 or on the control electrode of the thyristor 6. If the switch means 5 is actuated at the point of time $t_1$, the thyristor 6 will become conductive at the point of time $t_2$, whereby the half period, sectioned in FIG. 3, in the a.c. voltage is supplied to the load 7. At the point of time $t_3$ the switch means 5 is open again. Upon actuation on the switch means 5, the thyristor 6 is conductive for each positive "spike pulse" and current potential is supplied to the load or winding 7. At each negative zero transition after a load feeding half period, the thyristor 6 becomes non-conductive, and therefore the load 7 will always receive only positive pulses which always begin between zero and the break level of the zener diode 12. This is repeated as long as the switch means 5 is actuated.

For the utilization of the circuit arrangement described in the foregoing in an intermittently operating tool, e.g., an electrically operated stapler, an electrically operated nailer or like, in which the driving power is generated by means of the load 7, which in this case is a magnetic winding operating a magnet connected to a driven member, e.g., a driver spindle, this magnet is associated with the switch means 5 in such a way that the switch means is actuated upon the strokes of the spindle. Prior art circuits only produce a stroke or a pulse upon actuation of a switch means while the present circuit produces strokes or pulses as long as the switch means 5 is maintained closed.

As can be readily appreciated by those skilled in the art, the invention represented by FIG. 1 is basically a circuit for supplying electrical power to an inductive load 7 from an external source of alternating current (not shown) connected to terminals 3 and 4. The circuit of the invention utilizes a gate controlled electronic valve, in the form of thyristor 6 and a normally-open switch 5 both connected in series with the load 7 to deliver thereto electric current supplied from the electric power source, this electric current flowing through load 7 when switch 5 is closed and thyristor 6 is in a conducting state.

The combination of resistors 11 and 14, capacitor 13 and zener diode 12 can be regarded as defining a pulse-forming network, which by reason of the connections at terminals 8 and 10 is energized by the power source, through load 7, and is connected at terminal 9 to the gate of thyristor 6 and is operable to generate and apply thereto a sequence of electric pulses including pulses of predetermined polarity (positive) which are effective to trigger thyristor 6 into a conducting state when switch 5 is closed. It should be noted that this pulse forming network (contained within the block outline 2), is operable to generate the series of pulses shown in FIG. 2 independently of the state of switch 5. Thus, if switch 5 happens to be open, no current flow to load 7 through thyristor 6 will occur even though the required pulses are applied. However, only one switch 5 is required to be operated because the pulse-forming network is connected for continuous operation.

It can be appreciated by those familiar with pulse-forming networks, that in the invention the sinusoidal voltage applied to terminals 3 and 4 is impressed also across the resistor 11, zener diode 12 and inductance load 7 such that there is applied across zener diode 12 a sinusoidal voltage signal regardless of whether switch 5 is open or closed. This sinusoidal voltage is clipped by the operation of zener diode 12 so as to derive a square wave signal that is applied to the differentiator network constituted by capacitor 13 and resistors 14. Differentiation of a square wave type signal gives an output signal appearing across gate 9 and cathode 10 of thyristor 6 which is in the form of the series of spike pulse signals as shown in FIG. 2. Of the series of spike pulse signals, there are included pulses of positive and negative polarity in alternate sequence, but only the pulses of positive polarity are effective to trigger thyristor 6 into a conducting state. The values of resistance,capacitors and zener diode breakover voltage chosen for respective resistor elements 11 and 14, capacitor 13 and zener diode 12 can be selected in accordance with routine engineering calculations so as to give reliable triggering for the particular thyristor 6 used in combination with a particular impedance of the load 7.

What we claim and desire to secure by Letters Patent is:

1. A circuit for supplying electric power to an inductive load which comprises a gate controlled electronic valve and a switch both connected in series with the load to deliver thereto electric current from an electric power source when said switch is in a closed state and said electronic valve is in a conducting state, and means defining a pulse-forming network energized by said electric power source and connected to the gate of said electronic valve to generate and apply thereto a pulse signal in the form of a sequence of electrical pulses of predetermined polarity operable to trigger said electronic valve into a conducting state when said switch is closed to allow current flow through the valve, said pulse-forming network being operable to generate said sequence of pulses independently of the state of said switch, said pulse-forming network including circuit elements operable to derive a square wave signal from a sinusoidal alternating current source, and circuit elements connected to define a differentiator network to which said square wave signal is applied, said differentiator network being operable to derive from said square wave signal a pulse signal corresponding to the differentiated wave shape of the square wave signal and constituting said sequence of pulses applied to the gate of the electronic valve.

2. A circuit according to claim 1 wherein said electronic valve is a thyristor connected to and between the load and the switch.

* * * * *